(12) United States Patent
Gao

(10) Patent No.: US 11,901,259 B2
(45) Date of Patent: Feb. 13, 2024

(54) ACCLIMATED REGULATING SYSTEM FOR ELECTRONICS PACKAGES

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/011,662

(22) Filed: Sep. 3, 2020

(65) Prior Publication Data

US 2022/0068759 A1 Mar. 3, 2022

(51) Int. Cl.
| | |
|---|---|
| H01L 23/38 | (2006.01) |
| H10N 10/13 | (2023.01) |
| H10N 10/17 | (2023.01) |
| H10N 19/00 | (2023.01) |
| H01L 23/473 | (2006.01) |
| H01L 23/467 | (2006.01) |

(52) U.S. Cl.
CPC ............. *H01L 23/38* (2013.01); *H10N 10/13* (2023.02); *H10N 10/17* (2023.02); *H10N 19/00* (2023.02); *H01L 23/467* (2013.01); *H01L 23/473* (2013.01)

(58) Field of Classification Search
CPC ......... H01L 23/38; H01L 27/16; H01L 35/30; H01L 35/32; H01L 23/467; H01L 23/473; H01L 23/46; H10N 10/13; H10N 10/17; H10N 19/00; H10N 10/82

See application file for complete search history.

(56) References Cited

U.S. PATENT DOCUMENTS

| | | | | |
|---|---|---|---|---|
| 3,001,126 A | * | 9/1961 | Fritts ................. | G01K 7/06 |
| | | | | 136/200 |
| 4,301,658 A | * | 11/1981 | Reed .................. | F25B 21/04 |
| | | | | 62/3.61 |
| 6,084,172 A | * | 7/2000 | Kishi ................. | H01L 35/00 |
| | | | | 136/203 |
| 2010/0018222 A1 | * | 1/2010 | Tsuchida ........... | H01L 35/32 |
| | | | | 29/890.03 |

(Continued)

FOREIGN PATENT DOCUMENTS

WO WO-9308600 A1 * 4/1993 ............. H01L 23/34

*Primary Examiner* — Michael Y Sun
(74) *Attorney, Agent, or Firm* — WOMBLE BOND DICKINSON (US) LLP

(57) ABSTRACT

A self-acclimating electronics package includes an electronic chip, an electrically resistive material with a negative temperature coefficient of resistivity, the electrically resistive material being thermally coupled to the electronic chip, and a thermoelectric cooler thermally coupled to the electronic chip. The thermoelectric cooler is electrically connected in series with the electrically resistive material and a power supply to cool the electronic chip, where if a temperature of the electronic chip increases, a resistance of the electrically resistive material decreases to cause the a voltage supplied to the thermoelectric cooler to increase, and if a temperature of the electronic chip decreases, a resistance of the electrically resistive material increases to cause the a voltage/current applied to the thermoelectric cooler to decrease. This resilient self-acclimating cooling system eliminates any control hardware, firmware, and/or software which may be costly, complicated, and may require additional packaging space and/or tuning.

10 Claims, 9 Drawing Sheets

(56) References Cited

U.S. PATENT DOCUMENTS

| | | | |
|---|---|---|---|
| 2011/0006124 A1* | 1/2011 | Kai | G05D 23/1919 |
| | | | 236/46 R |
| 2012/0291832 A1* | 11/2012 | Okuda | H01L 35/30 |
| | | | 136/200 |
| 2019/0371995 A1* | 12/2019 | Tait | B60N 2/5642 |

* cited by examiner

ACCLIMATED REGULATING SYSTEM FOR ELECTRONICS PACKAGES

FIELD OF THE INVENTION

Embodiments of the present invention relate generally to electronics cooling. More particularly, embodiments of the invention relate to a method and a self-acclimated regulating system for electronics packages.

BACKGROUND

An active cooling control system for integrated circuit (IC) devices typically requires hardware and/or software components, including sensors, cables, and the software to regulate the system temperature. In some cases, a component failure in the cooling control system may negatively impact a system performance. In addition, such regulation system increases the packaging complexity.

For electronic packages, space is limited to implement an active cooling system for the electronic packages. Furthermore, a dedicated active cooling system may require a particular tuning procedure to operate under a particular operating condition.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
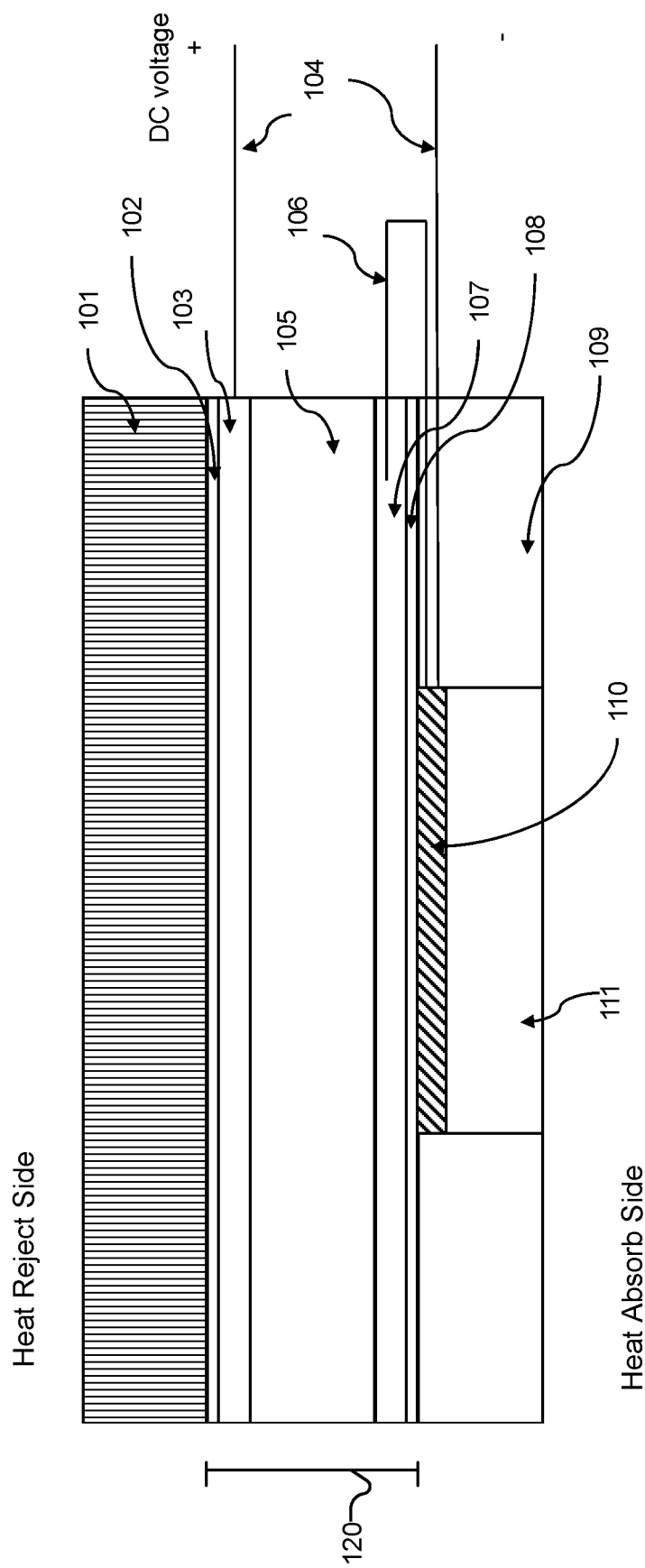
FIG. 1 is a block diagram illustrating a side view of a self-acclimating electronics package according to one embodiment.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Embodiments of the disclosure provide a thermoelectric cooling/Peltier cooling solution to cool integrated circuits (IC) chips/devices in an IC package. The cooling solution can be added to existing IC packages or the solution can be partially implemented as an embedded component of the IC in the IC package. Although embodiments are disclosed for IC packages, the following embodiments can also be applied for other industrial processes, in controlling and optimizing thermoelectric conversion, etc.

According to a first aspect, a self-acclimating electronics package includes an electronic chip, an electrically resistive material with a negative temperature coefficient of resistivity, the electrically resistive material being thermally coupled to the electronic chip, and a thermoelectric cooler thermally coupled to the electronic chip. The thermoelectric cooler is electrically connected in series with the electrically resistive material and a power supply to cool the electronic chip, where if a temperature of the electronic chip increases, a resistance of the electrically resistive material decreases to cause the a voltage supplied to the thermoelectric cooler that is connected in series in a loop to increase, and if a temperature of the electronic chip decreases, a resistance of the electrically resistive material increases to cause the a voltage supplied to the thermoelectric cooler to decrease. This resilient self-acclimating cooling system eliminates any control hardware, firmware, and/or software as well as control algorithm which may be less reliable, costly, complicated, and may require additional packaging space and/or tuning.

In one embodiment, the thermoelectric cooler includes a first thermal conducting layer, a second thermal conducting layer thermally coupled to the electronic chip, a first number of electrical conducting pads thermally coupled to the first thermal conducting layer, a second number of electrical conducting pads thermally coupled to the second thermal conducting layer, and a number of p-type and n-type alternating semiconductor pillars are sandwiched between (or thermally connected between) the first and the second thermal conducting layers. The p-type and n-type semiconductor pillars are electrically connected in series by the first and the second number of electrical conducting pads to receive a voltage supply.

In one embodiment, the electrically resistive material is situated between a portion of the electronic chip and the second thermal conducting layer, where the electrically resistive material senses a temperature at the portion of the electronic chip. In one embodiment, the electrically resistive material is embedded in at least one of the second number of electrical conducting pads which is thermally coupled to the second thermal conducting layer which is thermally coupled to a portion of the electronic chip, wherein the electrically resistive material senses a temperature at the second thermal conducting layer.

In one embodiment, the self-acclimating electronics package further includes a second electrically resistive material disposed on at least one of the first plurality of electrical conducting pads which is thermally coupled to the first thermal conducting layer, wherein the second electrically resistive material senses a temperature at a portion of the first thermal conducting layer. In one embodiment, the self-acclimating electronics package further includes a fan for air cooling, wherein the electrically resistive material is electrically connected to the fan to regulate a voltage supplied to the fan.

In one embodiment, the self-acclimating electronics package further includes a cooling plate thermally coupled to a portion of the first thermal conducting layer, where the electrically resistive material is electrically connected to a liquid (or fluid) pump/valve to regulate a liquid flow that cools the cooling plate. In one embodiment, the electrically resistive material with the negative temperature coefficient of resistivity includes a silicon material. In one embodiment, the electrically resistive material is an embedded component of the electronic chip.

According to a second aspect, a self-acclimating electronics package is disclosed. An electrically resistive material senses/measures a temperature at one or more sensing locations of the electronics package. If the measured temperature is greater than a target temperature, decreasing an electrical resistance of the electrically resistive material with a negative temperature coefficient of resistivity. If the measured temperature is less than the target temperature, increasing the electrical resistance of the electrically resistive material with the negative temperature coefficient of resistivity. The self-acclimating electronics package supplies a higher or a lower voltage to a thermoelectric cooler that is thermally coupled to an electronic chip of the electronics package, where the supplying is based on a change in the electrical resistance of the electrically resistive material, where the higher or the lower voltage supplied to the thermoelectric cooler causes a temperature measured at the one or more sensing locations to decrease or increase respectively. The thermoelectric cooler is electrically connected in series with the electrically resistive material and a power supply to cool the electronic chip, where if a temperature of the electronic chip increases, a resistance of the electrically resistive material decreases to cause the a voltage supplied to the thermoelectric cooler to increase, and if a temperature of the electronic chip decreases, a resistance of the electrically resistive material increases to cause the a voltage supplied to the thermoelectric cooler to decrease.

In one embodiment, the thermoelectric cooler includes a first thermal conductor, a second thermal conducting layer thermally coupled to the electronic chip, a first number of electrical conducting pads thermally coupled to the first thermal conducting layer, a second number of electrical conducting pads thermally coupled to the second thermal conducting layer, and a number of p-type and n-type alternating semiconductor pillars sandwiched between the first and the second thermal conducting layers. The p-type and n-type semiconductor pillars are electrically connected in series by the first and the second number of electrical conducting pads to receive a voltage supply.

In one embodiment, the electrically resistive material is situated between a portion of the electronic chip and the second thermal conducting layer, where the electrically resistive material senses a temperature at the portion of the electronic chip. In one embodiment, the electrically resistive material is disposed in at least one of the second plurality of electrical conducting pads which is thermally coupled to the second thermal conducting layer which is thermally coupled to a portion of the electronic chip, where the electrically resistive material senses a temperature at the portion of the electronic chip.

In one embodiment, a second electrically resistive material is disposed in at least one of the first plurality of electrical conducting pads which is thermally coupled to the first thermal conducting layer, where the second electrically resistive material senses a temperature at a portion of the first thermal conducting layer. In one embodiment, self-acclimating electronics package further supplies the higher or the lower voltage to a fan for air cooling of the electronic package based on the increase or the decrease in the electrical resistance, wherein the higher or the lower voltage supplied to the fan causes a temperature measured at the one or more sensing locations to decrease or increase respectively.

In one embodiment, self-acclimating electronics package further supplies the higher or the lower voltage to a liquid pump that regulates a liquid flow that cools a cooling plate for liquid cooling of the electronic package based on the increase or the decrease in the electrical resistance, wherein the cooling plate is attached to the first thermal conducting layer, wherein the higher or the lower voltage supplied to the liquid pump causes a temperature measured at the one or more sensing locations to decrease or increase respectively.

In one embodiment, the electrically resistive material with the negative temperature coefficient of resistivity includes a silicon material. In one embodiment, the electrically resistive material is embedded in the electronic chip.

FIG. 1 is a block diagram illustrating a side view of a self-acclimating electronics package according to one embodiment. In this example, FIG. 1 shows a side view of a self-acclimating electronics package 100. The self-acclimating electronics package can be an electronics packages for any types electronic chips, such as a processor, an integrated circuit (IC), application specific integrated circuits (ASIC), electronic sensors, microelectromechanical systems (MEMS) electronic devices, etc. Referring to FIG. 1, according to one embodiment, electronics package 100 includes electronic chip 111, one or more electrically resistive materials 110, a thermoelectric cooler (TEC) device 120, and fins 101. In one embodiment, fins 101 may instead be a liquid cooling/cold plate (not shown) and the resistance is connected in series with a control circulating the liquid to cool the cooling/cold plate, such as a valve and/or a pump (not shown).

In one embodiment, the TEC device 120 includes a semiconductors layer 105. The semiconductors layer 105 is electrically coupled in series through a first set of electrical conducting pads 103 and a second set of electrical conducting pads 107. The first set of electrical conducting pads 103 is situated at a first side (e.g., heat reject side) of the semiconductors layer 105 and the second set of electrical conducting pads 107 is situated at a second side (e.g., heat absorb side) of the semiconductors layer 105. The TEC device 120 further includes a first thermal conducting layer 102 and a second thermal conducting layer 108. The first thermal conducting layer 102 and the second thermal conducting layer 108 sandwiches the first set of electrical conducting pads 103, semiconductors layer 105, and the second set of electrical conducting pads 107. In one embodiment, the first thermal conducting layer 102 and the second thermal conducting layer 108 may include a ceramic, a substrate (e.g., Silicon dioxide), or any type of thermally conducting electrically insulating material.

Referring to FIG. 1, the electronic chip 111 is disposed on package mold 109 (such as an epoxy resin mold), where the electronic chip 111 is required to be cooled to a target temperature by the TEC 120. The electronic chip 111 is thermally coupled to the one or more resistive materials 110

(or resistors) with a negative temperature coefficient of resistivity. Here, the one or more resistive materials (e.g., resistors) 110 is electrically connected in series, by interconnect 106, with the TEC device 120 and interconnects 104, where the interconnects 104 supplies a power to the TEC device 120. The one or more resistive materials 110 can dynamically self-adjust depending on the thermal conditions which causes a variation in resistance of the resistors. The variation in the resistance of the resistors in turn causes a variation in a voltage or a current being supplied to the TEC device 120.

For example, the variation in resistance for resistors 110 cause a load seen by a constant DC voltage supply to the resistors/TEC device 120 to vary based on the equation $P=V^2/R$, where P is power, V is the constant DC voltage, and R is a resistance of the resistor 110. The varying load leads to a change in the power supplied to the TEC device 120. Here, the resistors can be determined by the formula: $R=R_o(1+a*dT)$, where R represents the resistance of the resistor at an operating temperature for resistors 110, $R_0$ represents an initial resistance, $R_0=R$ with zero dT, a represents the temperature coefficient of resistivity for resistors 110 (here, the material chosen has a negative a), and dT represents a difference between the operating temperature for the resistors 110 and a reference temperature specified for a for the resistor.

For some embodiments, one or more resistors are disposed at various locations of the ICs to be cooled. Examples of locations may be areas of high heat flux (e.g., directly at the ICs), areas having a normal direction of high thermal resistance, areas that has a strong performance correlation with a heat rejection side (e.g., a side where heat is removed, the side of fin 101). In one embodiment, the one or more resistors can be any shapes, sizes, or forms. For example, the resistors can be a strip, a rectangular, a circular, a sheet, or a tapered shape, or a combination thereof, which can be determined based on the design requirement for the resistance of the resistor. E.g., an area on top of electronics chip 111 may be covered by the resistors 110, where the area may be a most thermal sensitive area. As another example, the electronics chip may be partially covered by the resistor, or the resistor can have a larger footprint than the electronics chip and cover the electronics chip.

The resistance of the resistor can be determined based on a target cooling temperature for the electronics chip 111 (e.g., approximating the operating temperature of the resistor). For example, for a silicon resistor with approximately $\alpha=-0.07$/degrees Celsius, based on a target cooling temperature of 30 degrees Celsius and the reference temperature of 20 degrees Celsius, $dT=30-20=10$, $R=R_o(1+-0.07*(10))=0.3*r_o$. Thus, a resistance of resistor 110 can be selected based on a target temperature for the electronics chip 111.

Figure 2:
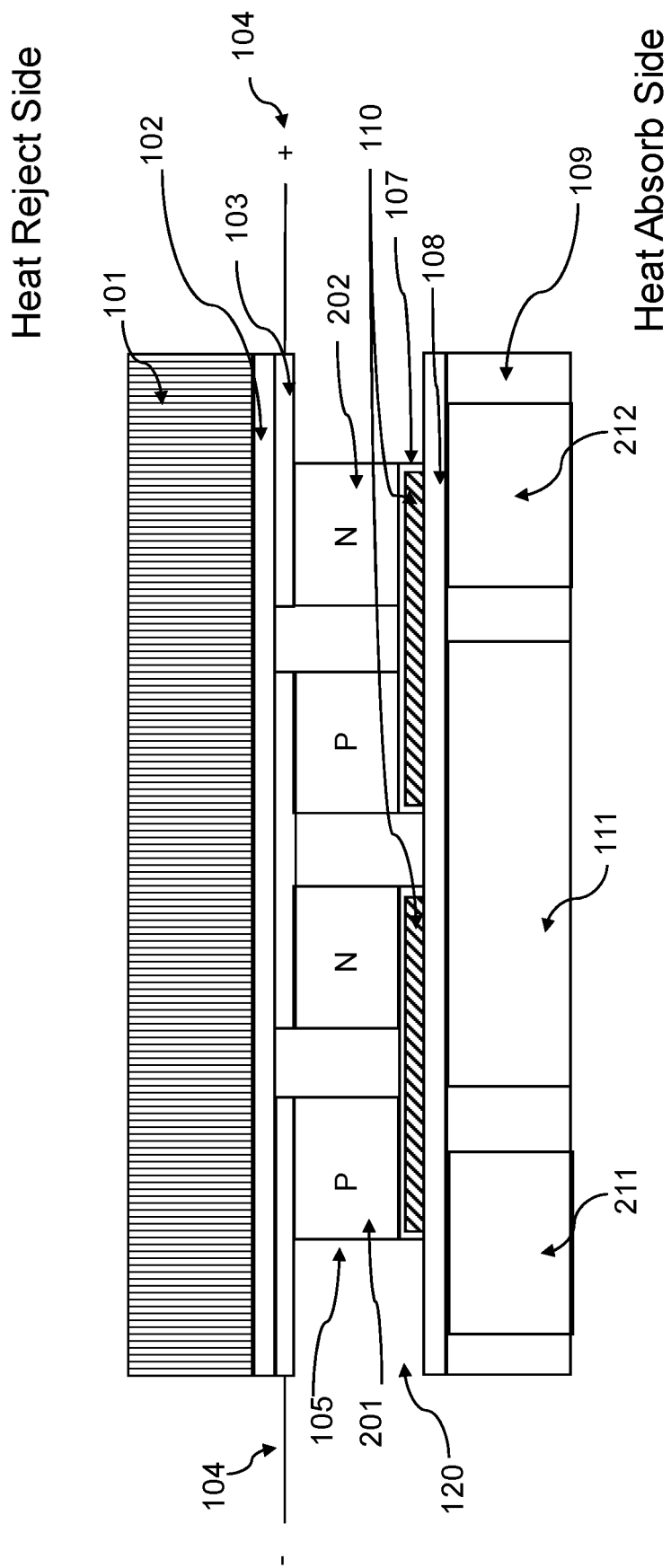
FIG. 2 is a block diagram illustrating a side view of a self-acclimating electronics package according to another embodiment.

FIG. 2 is a block diagram illustrating a side view of a self-acclimating electronics package according to another embodiment. Electronics package 200 may be similar to electronics package 100 with a modified configuration. For example, electronics package 200 may have electrical wires 104 at two opposite sides of package 200. In one embodiment, the resistors 110 may be disposed at one or more pads of conducting pads 107 to form a series electrical connection connecting TEC 120 to electrical wires 104 which is connected to a power supply (not shown). In this case, interconnect 106, as shown in FIG. 1, is not necessary in this modified configuration.

Referring to FIG. 2, semiconductor layer 105 includes one or more P semiconductor materials 201 and one or more N semiconductor materials 202. Alternating P and N semiconductor materials 201-202 are connected electrically in series (by conducting pads 103 and 107) and thermally in parallel (by thermal conducting layers 102 and 108). When a DC current passes through the P and N semiconductor materials 201-202, heat is absorbed at the heat absorb side and heat is released at the heat reject side for a hot side and a cold side for the TEC device 120.

Figure 3:
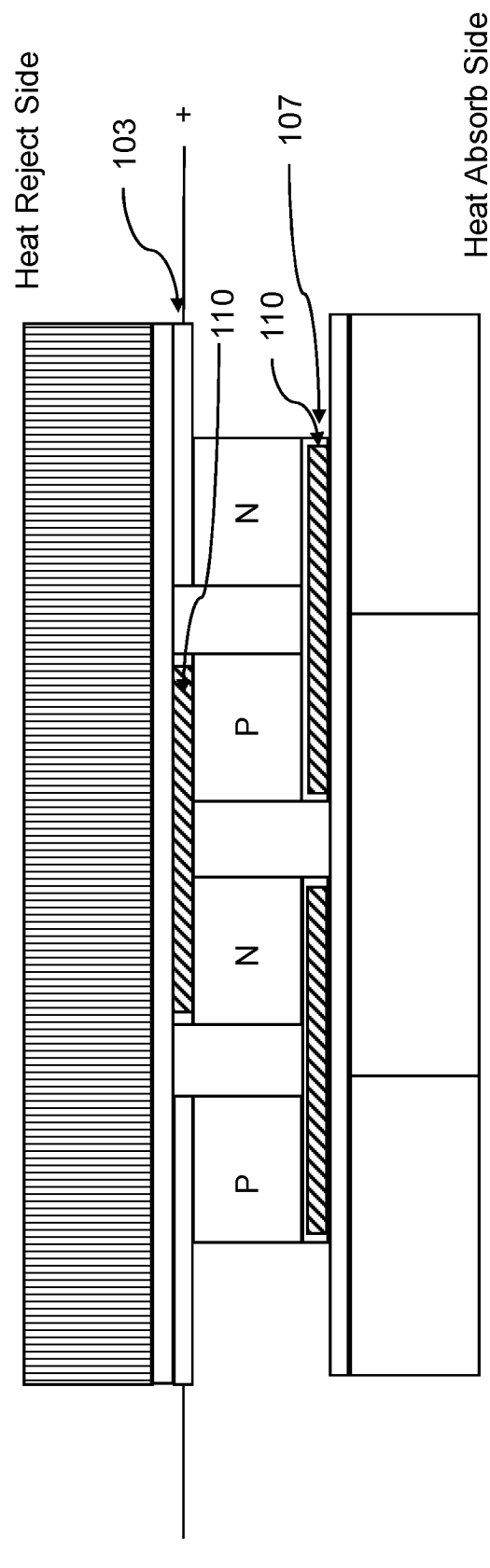
FIG. 3 is a block diagram illustrating a side view of a self-acclimating electronics package according to another embodiment.

FIG. 3 is a block diagram illustrating a side view of a self-acclimating electronics package according to another embodiment. Electronics package 300 may be similar to electronics package 200 of FIG. 2. Referring to FIG. 3, the resistors 110 may be disposed at one or more pads at both conducting pads 103 and conducting pads 107. In another embodiment, the one or more conducting pads 103 and 107 may be replaced by resistors 110. Here, the self-acclimating process would be driven by resistors 110 at conducting pads 107 sensing an operating temperature of the electronics chip 111 as well as the resistors 110 at conducting pads 103 sensing a temperature at the head reject side of electronics package 300.

In another embodiment, the electrically resistive material (or one or more resistors) includes a number of sub-resistors connected in either a parallel and/or a series configuration, and packaged either thermally coupled with the electronics chip 111 as shown in FIG. 1, or integrated into the conducting layer(s) 103/107 as shown in FIGS. 2-3, with different electrical wirings.

Figure 4A:
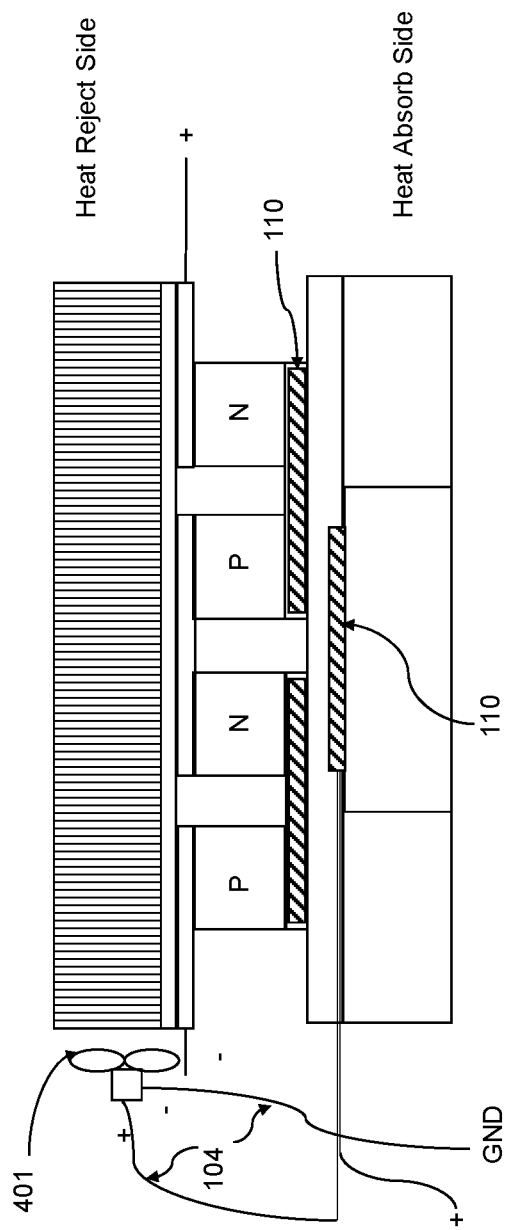
FIG. 4A is a block diagram illustrating a side view of a self-acclimating electronics package with a fan according to another embodiment.

FIG. 4A is a block diagram illustrating a side view of a self-acclimating electronics package according to another embodiment. Electronics package 400 may be similar to electronics package 200 of FIG. 2. Referring to FIG. 4A, the resistors 110, with negative temperature coefficient of resistivity, may be disposed at one or more pads at conducting pads 107 and may be disposed near/adjacent to electronics chip 111. Here, the resistors 110 adjacent to electronics chip 111 forms a series connection with a power supply (not shown) and a motor powering a fan 401. In one embodiment, when the sensed temperature increases for resistors 110 adjacent to the electronic chip 111, the resistance of resistors 110 adjacent to the electronic chip 111 decreases. The decreasing/increasing resistances causes the power ($P=V^2/R$) to increase/decrease, thus, increasing/decreasing a power and a speed of fan 401. E.g., an increased speed of fan 401 subsequently removes heat from "heat reject side" of electronics package 400 faster.

Figure 4B:
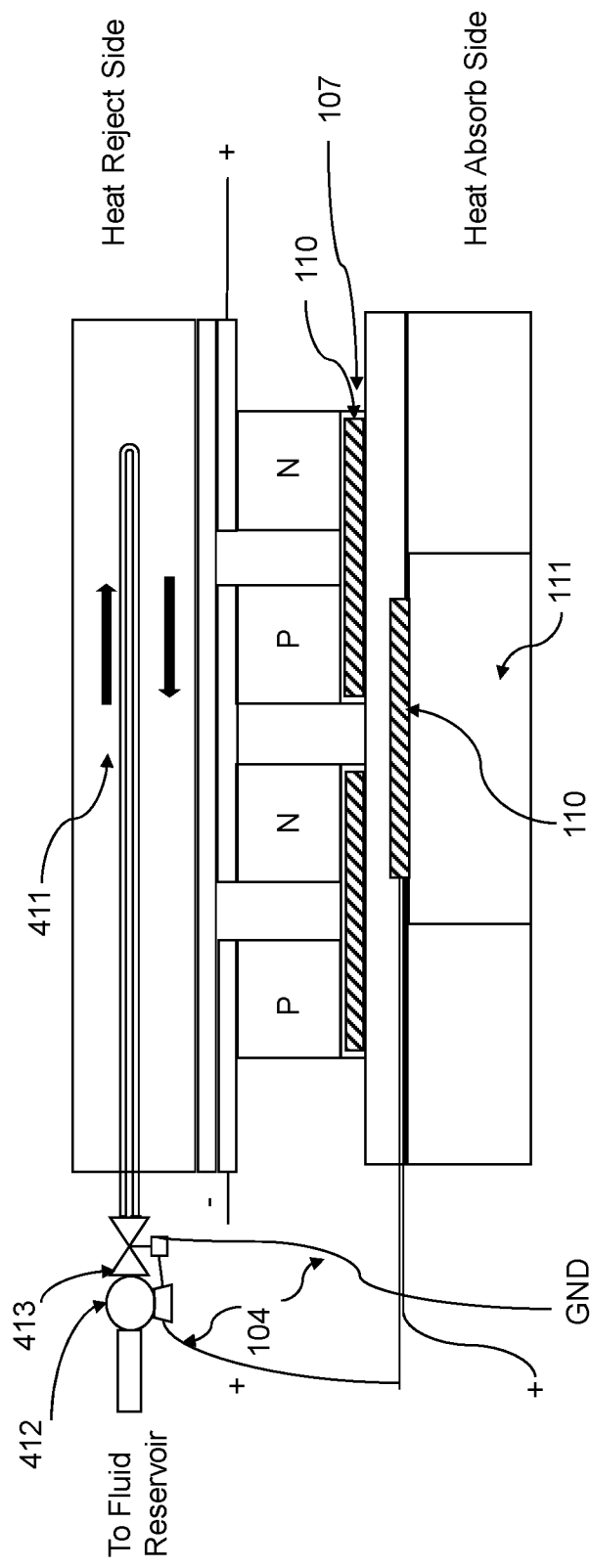
FIG. 4B is a block diagram illustrating a side view of a self-acclimating electronics package with fluid cooling according to another embodiment.

FIG. 4B is a block diagram illustrating a side view of a self-acclimating electronics package with fluid cooling according to another embodiment. Electronics package 410 may be similar to electronics package 400 of FIG. 4A. Referring to FIG. 4B, the resistors 110 adjacent to electronics chip 111 forms a series connection with a power supply (not shown), a pump 412 and/or a valve 413. In one embodiment, when the sensed temperature increases for resistors 110 adjacent to the electronic chip 111, the resistance of resistors 110 adjacent to the electronic chip 111 decreases. The decreasing resistances causes the power ($P=V^2/R$) to increase, thus, increasing a power to pump 412 and/or a valve 413. In one embodiment, the pump 412 and/or the valve 413 is operable to increase/decrease a fluid flow rate to cool cold plate 411. E.g., an increased power to pump 412 and/or valve 413 is operated to remove heat from "heat reject side" of electronics package 410 faster.

Figure 5:
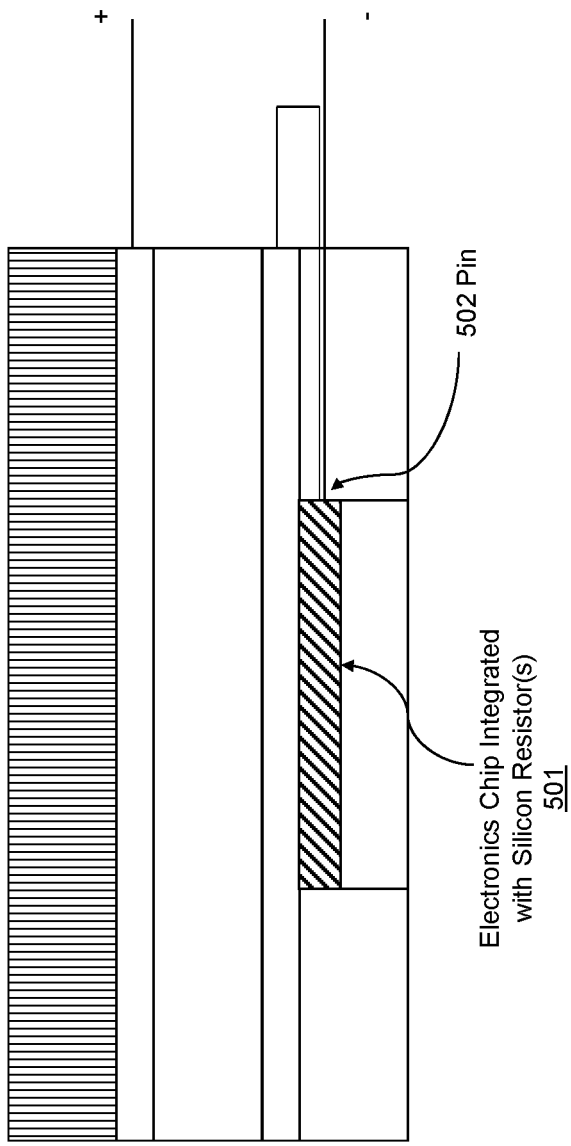
FIG. 5 is a block diagram illustrating a side view of a self-acclimating electronics package according to another embodiment.

FIG. 5 is a block diagram illustrating a side view of a self-acclimating electronics package according to another embodiment. Electronics package 500 may be similar to electronics package 200 of FIG. 2. Referring to FIG. 5, electronics chip 501 includes resistors 110 that is embedded in electronics chip 501. Here, resistors 110 may include a silicon material 110 that is deposited on a portion of electronics chip 501 during the manufacturing process for electronics chip 501. An additional pin 502 may be included for electronics chip 501 as a positive terminal connected to the silicon material 110, where the additional pin 502 is included as a specific pin definition and in a pinout diagram for electronics chip 501.

Figure 6:
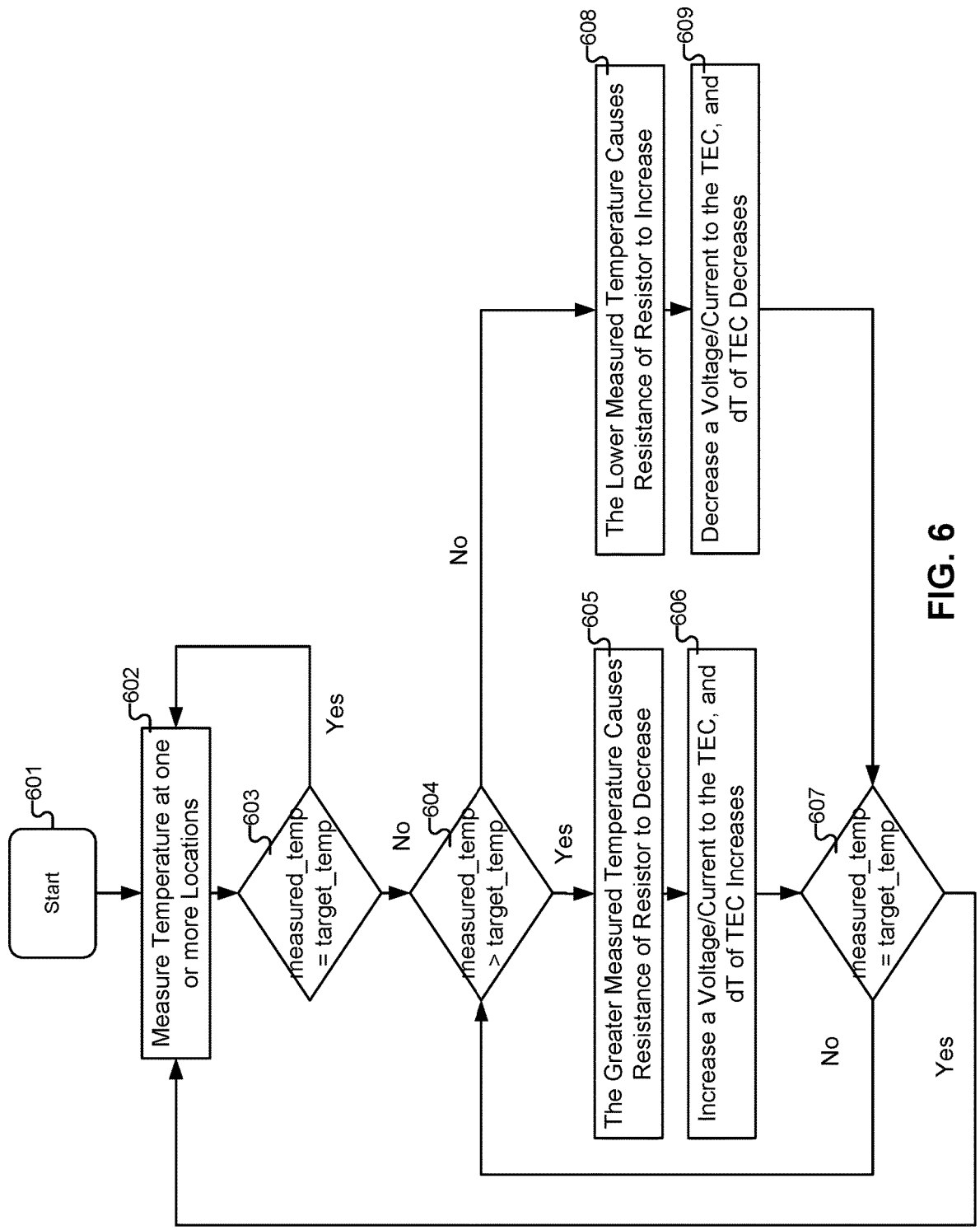
FIG. 6 shows a flow chart to regulate a temperature of the electronics package according to one embodiment.

FIG. 6 shows a flow chart to regulate a temperature of the electronics package according to one embodiment. Process 600 may be performed by a self-acclimating circuitry having a temperature dependent resistive material (such as, resistors 110 for electronics package 100-500 of FIGS. 1-5). Referring to FIG. 6, process starts at operation 601. At operation 602, one or more resistors 110 senses/measures a temperature at one or more locations near a portion of an electronics chip to be cooled. At operation 603, if it is determined that the measured temperature is equal to a target temperature (e.g., an equilibrium), process proceeds to operation 602. Here, the target temperature approximates a desired operating temperature of the electronics chip of the self-acclimating electronics package. Otherwise, process proceeds to operation 604. At operation 604, if it is determined that the measured temperature is greater than the target temperature, process proceeds to operation 605. Otherwise, process proceeds to operation 608. At operation 605, the greater measured temperature of the resistive material causes resistance of the resistive material to decrease. At operation 606, the decreased resistance of resistors 110 increases a voltage or a current to the TEC, which causes a temperature at the heat absorb side of the TEC to decrease, e.g., deltaT (dT) of the TEC increases. In turn, the measured temperature of the resistive material decreases. At operation 607, if it is determined that the measured temperature is equal to the target temperature (e.g., at an equilibrium), process proceeds to operation 602. Otherwise, process proceeds to operation 604.

At operation 608, the lower measured temperature causes resistance of the resistive material to increase. At operation 609, the increased resistance of resistive material decreases a power to the TEC device, which causes a temperature at the head absorb side of the TEC device to increase, e.g., deltaT (dT) of the TEC device decreases. In turn, the measured temperature of the resistive material increases. Note, the disclosed self-acclimating electronics package embodiments regulate a temperature near a portion of the electronics chip by design based on a selection of the target temperature without a dedicated temperature controller.

Figure 7:
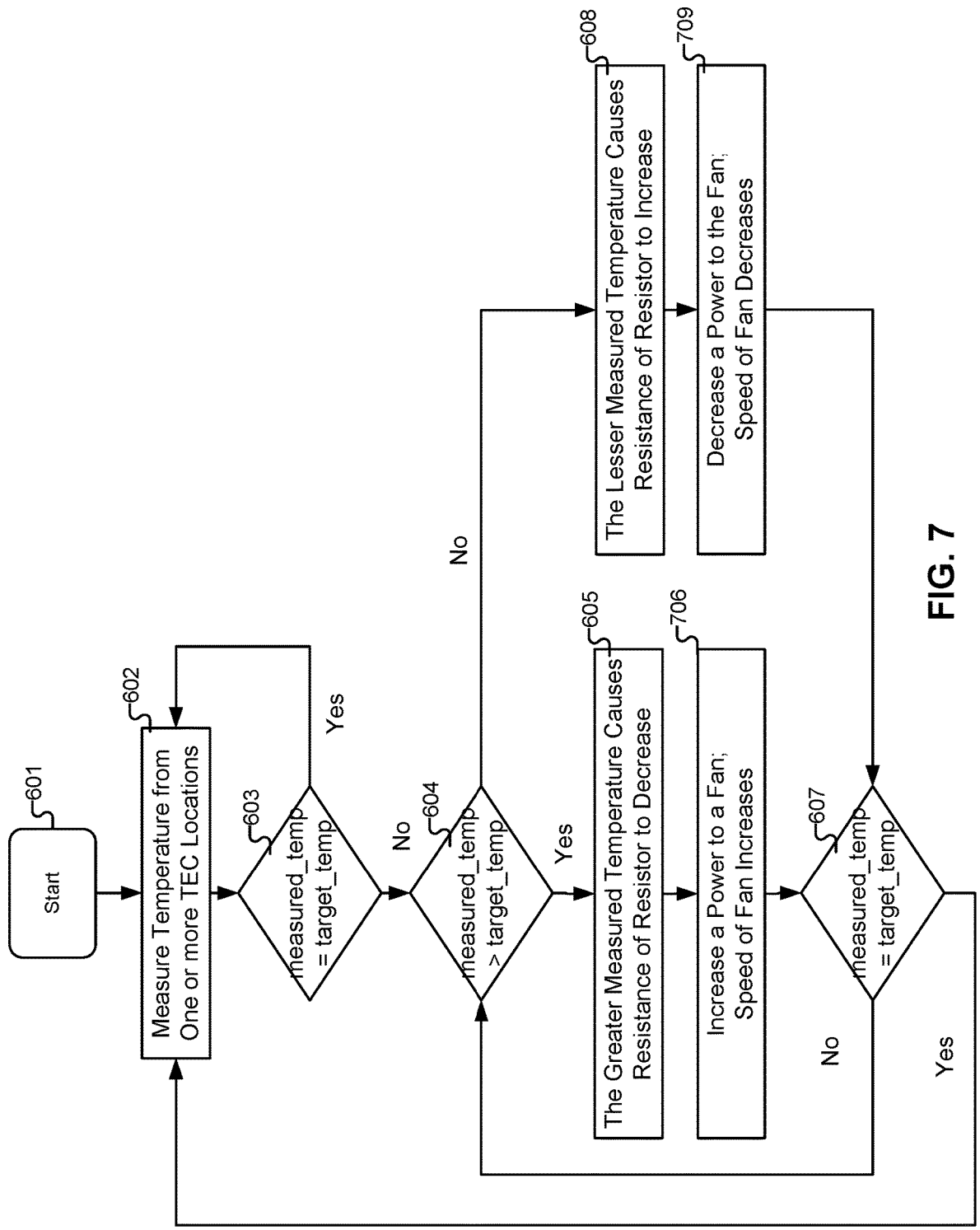
FIG. 7 shows a flow chart to regulate a temperature of the electronics package according to another embodiment.

FIG. 7 shows a flow chart to regulate a temperature of the electronics package according to another embodiment. Process 700 may be performed by a self-acclimating circuit having a temperature dependent resistive material (e.g., resistors 110 of electronics package 400 of FIG. 4). Process 700 can self-acclimate an electronics chip of the electronics package using a fan (such as fan 401 of FIG. 4) to remove heat quicker or slower from a heat rejection side of the electronics package. Process 700 is similar to process 600 of FIG. 6, except operation 606 is replaced by operation 706 and operation 609 is replaced by operation 709. Here, when a resistance of a resistive material 110 (connected in series with a fan 401) decreases due to a greater measured temperature, at operation 706, a series connection of the resistive material 110 to the fan causes a power to the fan to increase, thus, a speed of the fan increases. The increased fan speed reduces a temperature of the heat reject side of the electronics package quicker. When the resistance of the resistive material increases due to a lower measured temperature, at operation 709, the series connection of the resistive material to the fan causes a power of the fan to decrease, thus, a speed of the fan decreases. The decreased fan speed reduces a temperature of the heat reject side of the electronics package at a slower pace.

Figure 8:
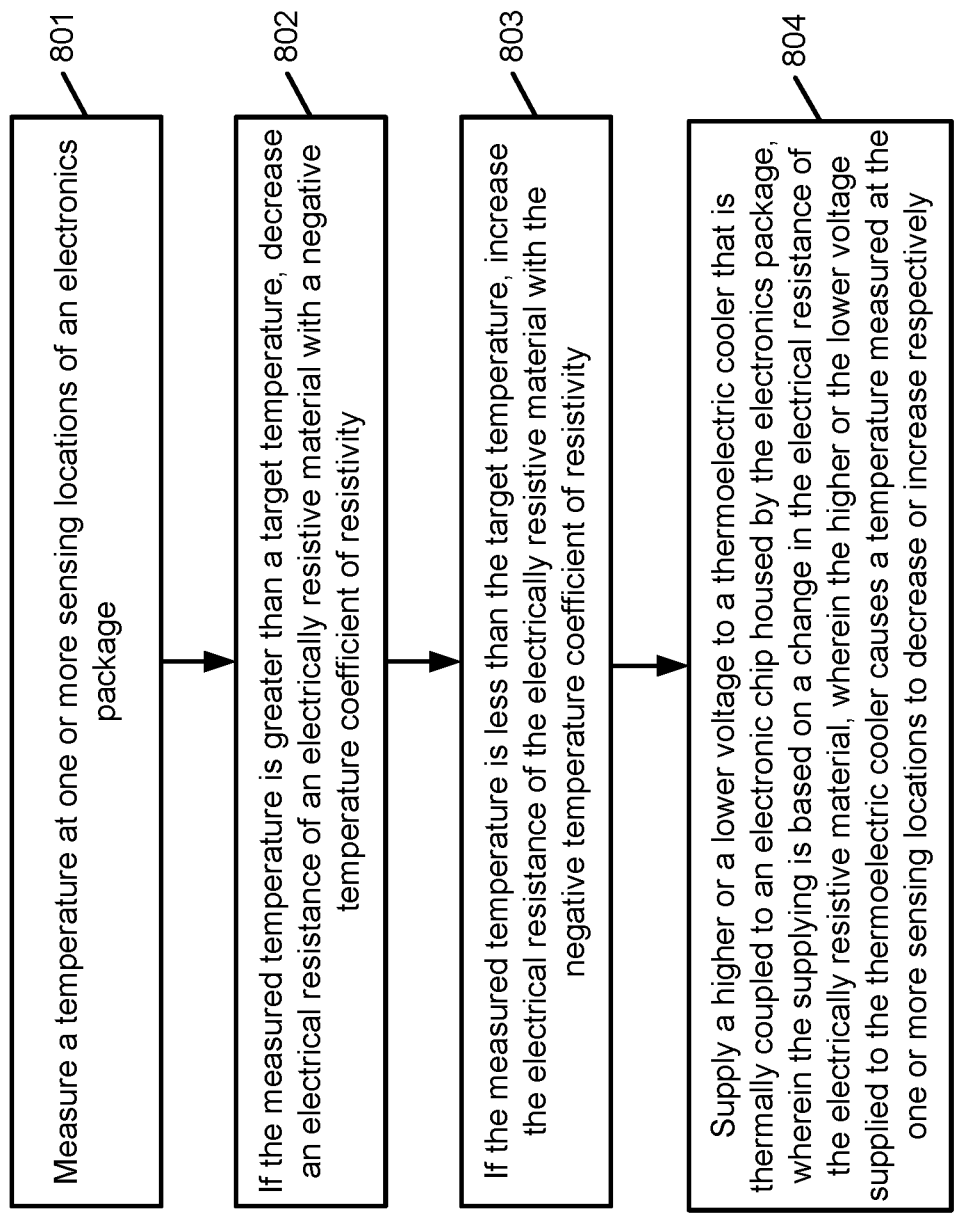
FIG. 8 shows a flow diagram according to one embodiment.

FIG. 8 shows a flow diagram according to one embodiment. Process 800 may be performed by a self-acclimating circuit having a temperature dependent resistive material (e.g., resistors 110 of FIG. 4) coupled to a fan and/or a TEC device of a self-acclimating electronics packages, e.g., any of electronics packages 100-500 of FIGS. 1-5. At operation 801, process measures a temperature at one or more sensing locations of an electronics package. At operation 802, if the measured temperature is greater than a target temperature, process decreases an electrical resistance of an electrically resistive material with a negative temperature coefficient of resistivity. At operation 803, if the measured temperature is less than the target temperature, process increases the electrical resistance of the electrically resistive material with the negative temperature coefficient of resistivity. At operation 804, process supplies a higher or a lower voltage to a thermoelectric cooler that is thermally coupled to an electronic chip of the electronics package, wherein the supplying is based on a change in the electrical resistance of the electrically resistive material, wherein the higher or the lower voltage supplied to the thermoelectric cooler causes a temperature measured at the one or more sensing locations to decrease or increase respectively. The thermoelectric cooler is electrically connected in series with the electrically resistive material and a power supply to cool the electronic chip, where if a temperature of the electronic chip increases, a resistance of the electrically resistive material decreases to cause the voltage supplied to the thermoelectric cooler to increase, and if a temperature of the electronic chip decreases, a resistance of the electrically resistive material increases to cause the voltage supplied to the thermoelectric cooler to decrease. A variation in voltage supplied to the thermoelectric cooler causes a variation in the heat transferring and pumping capability of a TEC which results in adjustment in temperature difference between the absorb side and the reject side of the TEC.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A self-acclimating electronics package, comprising:
an electrically resistive material with a negative temperature coefficient of resistivity, the electrically resistive material to be in direct contact with an electronic chip; and
a thermoelectric cooler thermally coupled to the electronic chip to cool the electronic chip, wherein the electrically resistive material is electrically connected in series between the thermoelectric cooler and a power supply, and wherein:
if a temperature of the electronic chip increases, a resistance of the electrically resistive material decreases to cause a voltage/current supplied by the power supply to the thermoelectric cooler to increase, and
if the temperature of the electronic chip decreases, a resistance of the electrically resistive material increases to cause the voltage/current supplied by the power supply to the thermoelectric cooler to decrease.

2. The self-acclimating electronics package of claim 1, wherein the thermoelectric cooler comprises:
   a first thermal conducting layer;
   a second thermal conducting layer thermally coupled to a portion of the electronic chip;
   a first plurality of electrical conducting pads thermally coupled to the first thermal conducting layer;
   a second plurality of electrical conducting pads thermally coupled to the second thermal conducting layer; and
   a plurality of p-type and n-type alternating semiconductor pillars sandwiched between the first and the second thermal conducting layers, wherein the plurality of p-type and n-type semiconductor pillars are electrically connected in series by the first and the second plurality of electrical conducting pads to receive a power supply.

3. The self-acclimating electronics package of claim 2, wherein the electrically resistive material is situated between the portion of the electronic chip and the second thermal conducting layer, wherein the electrically resistive material senses a temperature at the portion of the electronic chip.

4. The self-acclimating electronics package of claim 2, wherein the electrically resistive material is disposed in at least one of the second plurality of electrical conducting pads which is thermally coupled to the second thermal conducting layer which is thermally coupled to a portion of the electronic chip, wherein the electrically resistive material senses a temperature at the second thermal conducting layer.

5. The self-acclimating electronics package of claim 4, further comprising a second electrically resistive material disposed in at least one of the first plurality of electrical conducting pads which is thermally coupled to the first thermal conducting layer, wherein the second electrically resistive material senses a temperature at a portion of the first thermal conducting layer.

6. The self-acclimating electronics package of claim 1, further comprising a fan for air cooling, wherein the electrically resistive material is electrically connected to the fan to regulate a power supplied to the fan.

7. The self-acclimating electronics package of claim 2, further comprising a liquid cooling plate thermally coupled to a portion of the first thermal conducting layer, wherein the electrically resistive material is electrically connected to a liquid pump to regulate a liquid flow that is cooling the liquid cooling plate.

8. The self-acclimating electronics package of claim 1, wherein the electrically resistive material with the negative temperature coefficient of resistivity includes a silicon material.

9. The self-acclimating electronics package of claim 2, wherein the electrically resistive material is embedded in the electronic chip.

10. The self-acclimating electronics package of claim 2, wherein the electrically resistive material includes a plurality of sub-resistors connected in either a parallel and/or a series configuration.

* * * * *